United States Patent [19]

Fujishima et al.

[11] 4,243,897
[45] Jan. 6, 1981

[54] CHARGE COUPLED SEMICONDUCTOR DEVICE STORING 2-BIT INFORMATION

[75] Inventors: Kazuyasu Fujishima; Michihiro Yamada; Kouichi Nagasawa, all of Itami, Japan

[73] Assignee: Mitsubishi Denki Kabushiki Kaisha, Tokyo, Japan

[21] Appl. No.: 901,258

[22] Filed: Apr. 28, 1978

[30] Foreign Application Priority Data

Apr. 28, 1977 [JP] Japan ................................ 52/49231

[51] Int. Cl.³ ................ G11C 19/28; H01L 29/78
[52] U.S. Cl. .................. 307/221 D; 357/24
[58] Field of Search ................. 357/24; 307/221 D

[56] References Cited

U.S. PATENT DOCUMENTS

| | | | |
|---|---|---|---|
| 3,935,477 | 1/1976 | Strain et al. | 307/221 D |
| 4,080,581 | 3/1978 | Sakaue et al. | 307/221 D |
| 4,085,459 | 4/1978 | Hirabayashi | 307/221 D |
| 4,112,456 | 9/1978 | Lampe et al. | 307/221 D |

OTHER PUBLICATIONS

Sequin et al., *Charge Transfer Devices*, Academic Press, N.Y. (1975), pp. 23-25, 48-51, 62-65.
Mohsen et al., "A 64-Kbit Block Addressed Charge-Coupled Memory," IEEE Trans. Electron Devices, vol. ED-23 (2/76), pp. 117-126.
Rosenbaum et al., "A 1638-Bit High-Density CCD Memory," IEEE Trans. Electron Devices, vol. ED-23 (2/76, pp. 101-108.
Kohyama et al., "A New Multiphase Electrode-Per-Bit Structure for CCD Memory," Proc. 8th Conf. (1976 Int.), Solid State Devices, Japanese J. Applied Physics, vol. 16 (1977), Supple. 16-1, pp. 383-386.

*Primary Examiner*—Gene M. Munson
*Attorney, Agent, or Firm*—Wenderoth, Lind & Ponack

[57] ABSTRACT

The single input gate electrode in a conventional CCD shift register is replaced by four spaced electrodes. The fourth electrode adjacent to the first transfer electrode has an area larger than that of the second electrode which always has a DC voltage applied thereto. Three driving pulses are applied in a predetermined sequence to the first, third and fourth electrodes while the two bit values of 2-bit information are written into the register and a charge is accumulated directly under the fourth input gate electrode at one of four levels as determined by the combination of the write bit values. Then the accumulated charge is stepwise transferred in the same manner as in conventional CCD shift registers.

3 Claims, 12 Drawing Figures

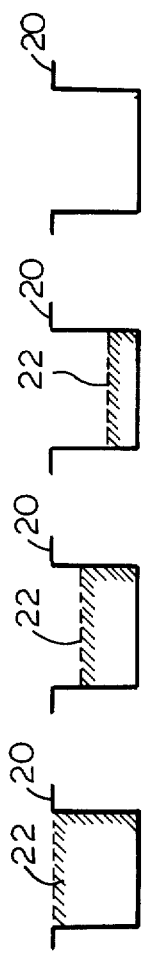
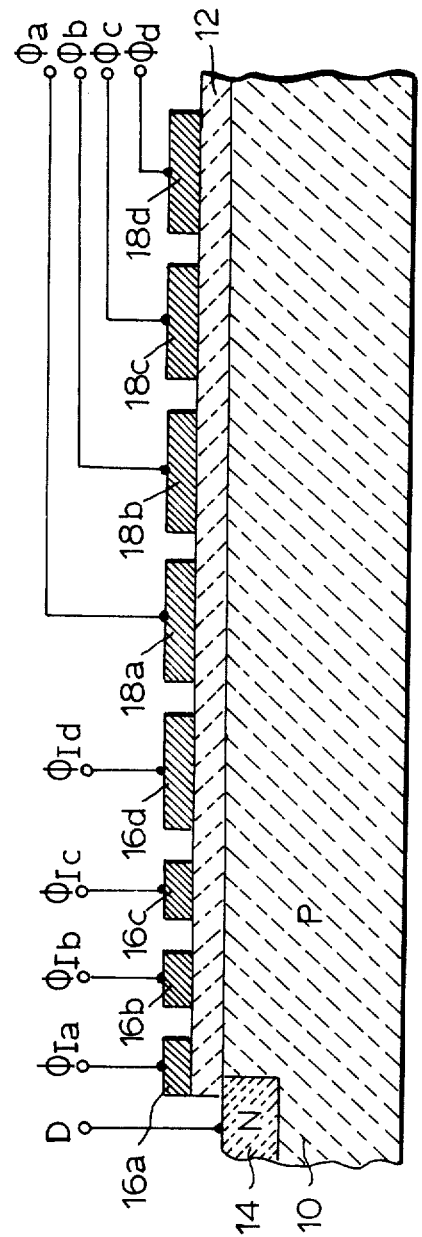

4,243,897

CHARGE COUPLED SEMICONDUCTOR DEVICE STORING 2-BIT INFORMATION

BACKGROUND OF THE INVENTION

This invention relates to improvements in a charge coupled semiconductor device and to a method of driving the improved device.

One well known example of charge coupled device (which is sometimes abbreviated hereinafter as "CCD") configuration shift registers includes a plurality of bit positions each formed by four transfer electrodes which stepwisely transfers binary information by means of four phase driving pulses applied in a predetermined sequence to the transfer electrodes. Since each bit position is formed by four transfer electrodes it can not be said that such a shift resister has a high degree of intergration. Also, since the quantity of electric charge which can be accumulated under each transfer electrode is proportional to the area of that electrode, an increase in the degree of intergration due to, for example, a decrease in electrode area or adoption of a multi-level accumulation of electric charge encounters problems because the output from such shift resisters has an insufficient sensitivity and a reduced signal-to-noise ratio.

Accordingly it is an object of the present invention to provide a new and improved charge coupled semiconductor device having an increased degree of integration.

It is another object of the present invention to provide a new and improved charge coupled semiconductor device having an increased data storage density with the configuration of the transfer electrodes remaining unchanged from the prior art practice and also to provide a method for driving such a device.

It is still another object of the present invention to provide a new and improved charge coupled semiconductor device capable of storing 2-bit information in each electrode unit forming one bit position.

It is an additional object of the present invention to provide a new and improved charge coupled semiconductor device with an increased quantity of transferable charge.

SUMMARY OF THE INVENTION

According to one aspect of the present invention, there is provided a charge coupled semiconductor device comprising a semiconductor layer of a first type conductivity including a main face, an electrically insulating film disposed on the main face of the semiconductor layer, an electrode array of a plurality of transfer electrodes disposed a spaced relationship at predetermined intervals on the electrically insulating film to transfer electric charge in a predetermined direction along the main face of the semiconductor layer, a charge injection means composed of an electrically conductive region disposed to form a PN junction with the semiconductor layer, the electrically conductive region being responsive to an input signal applied thereto to produce an electric charge in the semiconductor layer, an input gate unit cnsisting of first, second, third and fourth input gate electrodes disposed on the electrically insulating film between the electrically conductive region and the transfer electrode on the input side of the electrode array, the input gate electrodes housing predetermined spacings therebetween, the fourth input gate electrode being disposed adjacent to the transfer electrode on the input side of the electrode array having a predetermined spacing therebetween and having an area larger than that of at least the second input gate electrode, and a means for selectively applying signals to the first, second, third and fourth input gate electrodes to form an electric charge corresponding to the sum of the electric charges caused by a pair of the input signals injected into the electrically conductive region by the charge injection means.

According to the other aspect of the present invention, there is provided a method for driving the charge coupled semiconductor device as recited in the preceding paragraph, comprising a first step of applying signals to the first, second, third and fourth input gate electrodes to write a first input signal into the semiconductor layer through the charge injection means, a second step of removing the signal applied to the third input gate electrode to store the charge of the first input signal directly under the fourth input gate electrode, a third step of applying a signal to the first input gate electrode to write a second input signal into the semiconductor layer through the charge injection means, a fourth step of removing the signal applied to the first input gate electrode to store the charge of the second input signal directly under the second input gate electrode which always has a predetermined signal applied thereto, and a fifth step of applying signals to the second, third and fourth input gate electrodes to form a charge corresponding to the sum of the quantities of charge corresponding to the first and second input signals.

BRIEF DESCRIPTION OF THE DRAWINGS

The present invention will become more readily apparent from the following detailed description taken in conjunction with the accompanying drawings in which:

FIGS. 4a through 4d are diagrams illustrating four quantities of charge accumulated in a potential well defined directly under the transfer electrode shown in FIG. 1;

FIG. 5 is a cross sectional view of one embodiment according to the CCD shift register of the present invention;

Throughout the figures like reference numerals and characters designate the identical or corresponding components.

DESCRIPTION OF THE PREFERRED EMBODIMENTS

Figure 1:
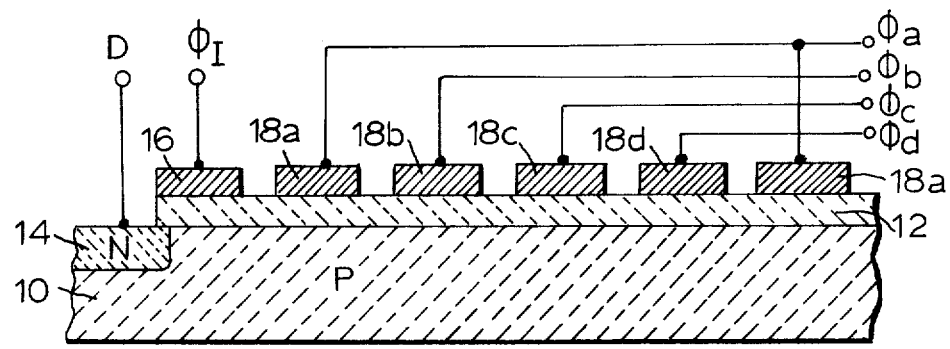
FIG. 1 is a partial cross sectional view of a conventional shift register having a typical charge coupled device configuration.

Referring now to FIG. 1 of drawings, there is illustrated a conventional shift register having a typical charge coupled device configuration. The arrangement illustrated comprises a P type semiconductor substrate or layer 10, a thin gate film 12 of an electrically insulating material disposed on the semiconductor layer 10, and an N type diffusion region 14 disposed in the P type semiconductor layer 10 forming a PN junction therebetween and more or less overlapping the gate insulating film 12.

An input gate electrode 16 is disposed on that edge portion of the insulating film 12 overlapping the N type region 14 and a plurality of transfer electrodes are disposed at predetermined equal intervals on the gate insulating film 12. In the example illustrated four transfer electrodes 18a, 18b, 18c and 18d form each a group that is followed by the next a succeeding similar group to form an electrode array including any desired number of transfer electrodes. The spacing between the input gate electrode 16 and the first transfer electrode 18a of the first group and that between each pair of adjacent transfer electrodes is shown in FIG. 1 as being equal to one another.

As shown in FIG. 1, the transfer electrodes 18a, 18b, 18c and 18d in each group are connected in a parallel circuit relationship to the corresponding electrodes in the ramaining groups and adapted to have respective driving pulses $\phi_a$, $\phi_b$, $\phi_c$ and $\phi_d$ applied thereto. An information input signal D is applied to the N type diffusion region 14 and the signal $\phi_I$ applied to the input gate electrode 16 is enabled when the state of the information input signal D is written in the first transfer electrode 18a of the first group.

In this way there is produced an N channel type shift register driven by four phase positive pulses with each bit position formed by the four transfer electrodes 18a, 18b, 18c and 18d which is the most prevalent and popular configuration for the charge coupled semiconductor device.

The operation of the arrangement shown in FIG. 1 can be divided into three stages, that is, a first stage of injecting an electric charge dependent upon the application of an information input signal or pulse D, a second stage of transferring the charge along the array under the transfer electrodes 18a, 18b, 18c and 18d, and a third stage of sensing the charge on the associated output side (not shown).

Figure 2:
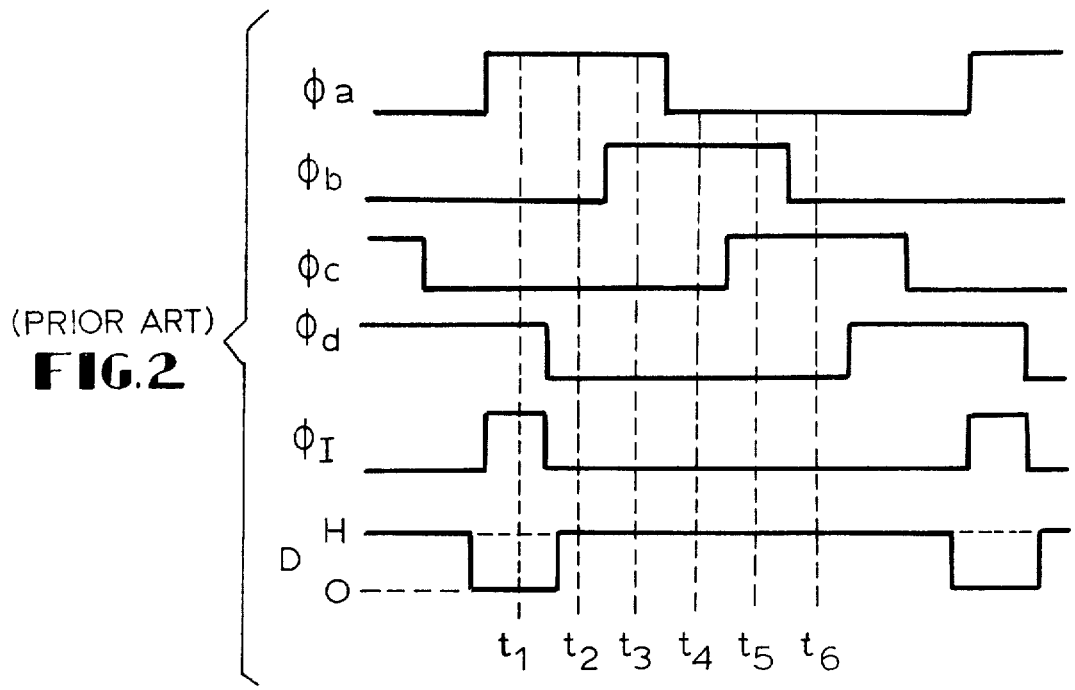
FIG. 2 is a graph illustrating the waveforms of the driving pulses used for driving the arrangement shown in FIG. 1.

As shown in FIG. 2, driving pulse waveforms $\phi_a$, $\phi_b$, $\phi_c$ and $\phi_d$ are applied to the transfer electrodes 18a, 18n, 18c and 18d which successively overlap on one another while a signal waveform $\phi_I$ is applied to the input gate electrode 16 and an input signal waveform D is applied to the diffusion region 14 at time point $t_1$. When those waveforms are applied to the arrangement of FIG. 1, at time points $t_1$, $t_2$, $t_3$, $t_4$, $t_5$ and $t_6$ shown in FIG. 2 the potential curves of the device have respective shapes as shown in the rows labelled $t_1$, $t_2$, $t_3$, $t_4$, $t_5$ and $t_6$ in FIG. 3 wherein each potential curve is designated by the reference character 20. More specifically, potential wells are spatially defined in the semiconductor layer 10 directly under those electrodes as shown on the upper portion of FIG. 3 having the associated waveforms illustrated in FIG. 2 applied thereto and an electric charge is stored in each of these potential wells as shown by a hatched portions 22 in FIG. 3.

A description will first be made in conjunction with the entry of an input pulse D having a binary value of ZERO or ONE into the shift register as shown in FIG. 1. When a driving pulse $\phi_a$ with a positive voltage is applied to the transfer electrode 18a of the first group (see waveform $\phi_a$, FIG. 2), the entry of a binary ONE is accomplished by applying a driving pulse $\phi_I$ to the input gate electrode 16 during a time near to and including time point $t_1$ while a low voltage close to the ground potential is maintained on the diffusion region 14 by an input pulse D (see waveform D, FIG. 2) substantially simultaneously with the application of the driving pulse $\phi_I$. This results in an electric charge 22 filling a potential well defined under the electrodes 16 and 18a in the semiconductor layer 10 (see row $t_1$, FIG. 3).

On the contrary, the entry of a binary ZERO is different from the entry of the binary ONE only in that the input pulse D is a relatively high positive voltage and not a low voltage. In the latter case, the above-mentioned potential well is empty.

Figure 3:
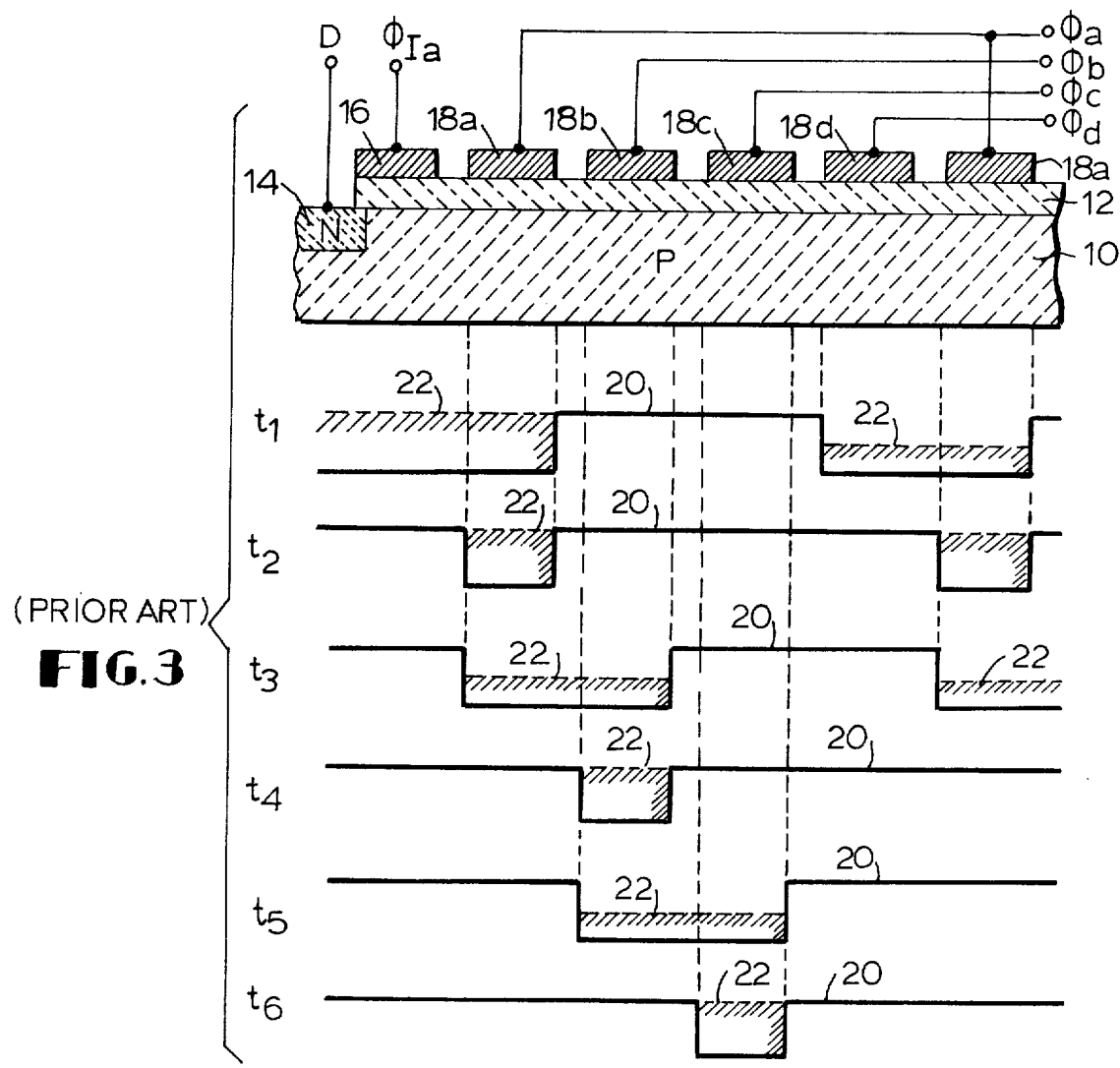
FIG. 3 is a replica of FIG. 1 and a graph illustrating the quantities of electric charge accumulated in the arrangement of FIG. 1 having the driving pulses shown in FIG. 2 applied thereto.

Then at time point $t_2$ the driving pulse $\phi_I$ disappears from the input gate electrode 16 whereupon the charge 22 moves over the surface of the semiconductor layer 10 to and is stored in a potential well defined directly under the transfer electrode 18a alone (see row $t_2$, FIG. 3). Also it will readily be understood that the entry of a binary ZERO results in the emptiness of that potential well 22.

In this way, the input signal or pulse D has been written into the arrangement of FIG. 1.

Following this, the transfer of the charge 22 is effected.

At time point $t_3$ the driving pulses $\phi_a$ and $\phi_b$ are applied to the transfer electrodes 18a and 18b as shown in FIG. 2, thereby moving the potential well to under both those electrodes which is accompanied by the storage of the charge 22 in the moved potential well (see row $t_3$, FIG. 3).

Then at time point $t_4$ the driving pulse $\phi_a$ is removed from the transfer electrode 18a of the first group while the driving pulse $\phi_b$ remains applied to the transfer electrode 18b thereof as shown in FIG. 2. Under these circumstances, the charge 22 is stored in a potential well located directly under the transfer electrode 18b alone (see row $t_4$, FIG. 3).

As shown in FIG. 2, the driving pulse $\phi_c$ is applied to the transfer electrode 18c between time points $t_4$ and $t_5$ while the driving pulse $\phi_b$ disappears from the transfer electrode 18b between time points $t_5$ and $t_6$. Therefore the process as above described is repeated until the charge is retained in the potential well defined directly under the transfer electrode 18c as shown in row $t_6$ in FIG. 3.

In this way the driving pulses $\phi_a$, $\phi_b$, $\phi_c$ and $\phi_d$ are successively applied to the transfer electrodes 18a, 18b, 18c and 18d so that each pair of adjacent electrodes have driving pulses are applied thereto in an overlapping relationship thereby stepwisely shifting the charge written in the diffusion layer 14 through the semiconductor layer 10 to occupy successive positions directly under each of the transfer electrodes 18a, 18b, 18c and 18d in the semiconductor layer 10.

When the input signal D has a value of binary ZERO the empty potential well is moved under the transfer electrodes of the first group in the same manner as above described.

When supplied with the driving pulses, the arrangement of FIG. 1 creates and stores minority carriers in potential wells defined under the transfer electrodes of groups other than the first group such as shown in FIG. 3 in the same manner as described above.

Once the stepwisely transferred charge has arrived at the output stage (not shown) it is sensed by suitable sensor means well known in the art. The output stage and the sensor means form no part of the present invention and therefore are not described herein.

In conventional CCD shift registers such as shown in FIG. 1, that portion of the semiconductor layer 10 or a potential well located directly under each of the transfer electrodes 18a, 18b, 18c and 18d can have only one of two states, one state is filled with a charge dependent upon the input pulse D to indicate a binary ONE and the other state is empty to indicate a binary ZERO. Either of the two states is transferred through the shift register bit position by bit position by means of the four phase pulse drive operatively associated with electrode groups each having four transfer electrodes 18a, 18b, 18c and 18d. In other words, each bit position of the register requires four transfer electrodes. Therefore it can not be said that shift registers such as shown in FIG. 1 have a high degree of integration.

Further, according to the charge transfer process as described above, the charge accumulation state always exists in that portion of the semiconductor layer or that potential well located under one of transfer electrodes alone. The quantity of charge capable of being accumulated under that electrode is determined by an area occupied by the charge. Thus the maximum quantity of transferred charge is given by the quantity of charge prescribed by the area of a single electrode. On the other hand, if a high degree of integration is sought by means of either decreasing the area of the electrodes or providing multi-level accumulation that imparts a plurality of states in which a charge is selectively filled at a plurality of levels to the same electrode, the quantity of transferable charge is decreased which creates the problems that the signal output from the shift register lacks sensitivity and is reduced in signal-to-noise ratio.

The present invention will now be described in detail with reference to FIG. 4 et seqq. In the charge coupled semiconductor device of the present invention an electric charge can be selectively stored in a potential well spatially defined under each of transfer electrodes involved as shown in FIGS. 4a, 4b, 4c and 4d. Therefore 2-bit information or a pair of input signals or pulses D as above described can be stored under a single transfer electrode.

More specifically, assuming that this 2-bit information is expressed by (A, B) with bit A higher in bit position than a bit B, FIG. 4a shows an electric charge 22 completely filling a potential well defined directly under an electrode by a potential curve 20. This represents 2-bit information in which the bits A and B each have a value of binary ONE and is expressed by (1,1). When the bit A is of binary ONE and the bit B is of a binary ZERO that is, when the particular 2-bit information is expressed by (1, 0), two thirds of the depth of the potential well is filled with charge as shown in FIG. 4b. When the bits A and B are binary ZERO and ONE respectively, that is, when the 2-bit information is (0, 1), one third of the depth of the potential well is filled with the charge as shown in FIG. 4c. Finally, FIG. 4d shows the potential well that is empty to indicate that it stores the 2-bit information (0, 0) in which the bits are both binary ZERO.

By doing so, the information storage content can be doubled while the number of transfer electrodes remains unchanged from that of the shift register of the conventional CCD configuration as described above in conjunction with FIG. 1.

FIG. 5 is a fragmental cross sectional view of a CCD shift register including an input gate unit for realizing the charge accumulation states shown in FIGS. 4a, 4b, 4c and 4d constructed in accordance of one aspect of the present invention. The arrangement illustrated is different from that shown in FIG. 1 only in the input gate unit. The input gate unit includes a plurality of input gate electrodes disposed in a spaced relationship on the electrically insulating film 12 between the N type diffusion region 14 and the transfer electrode 18a of the first group. In the example illustrated four input gate electrodes 16a, 16b, 16c and 16d are spaced from one another by a predetermined distance equal to the spacing between each pair of adjacent transfer electrodes. Also the spacing formed between the last or fourth input gate electrode 16d and the transfer electrode 18a of the first group is equal to the abovementioned spacing. However it is to be understood that those spacings need not be equal to one another. The first, second and third input gate electrodes 16a, 16b and 16c respectively are equal in area to one another while the fourth input gate electrode 16d has an area equal to twice that of each electrode 16a, 16b or 16c and which is substantially equal to the area of each transfer electrode 18a, 18b, 18c or 18d.

Figure 6:
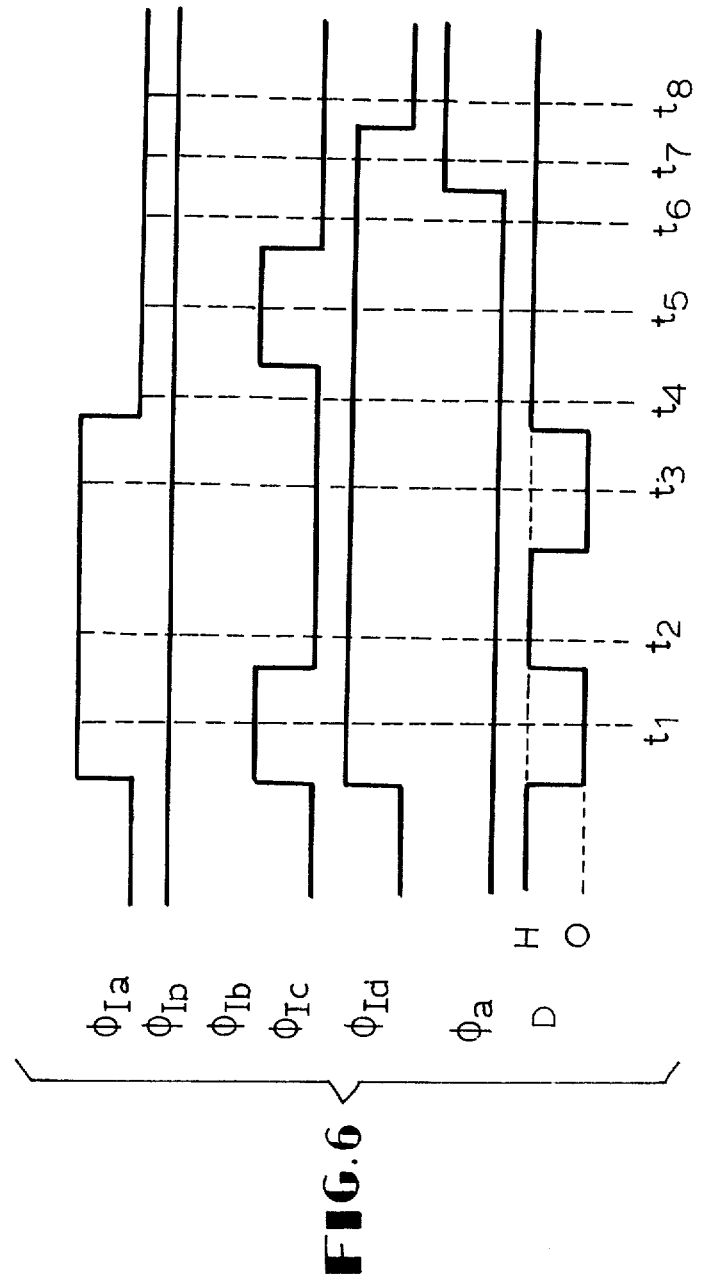
FIG. 6 is a graph illustrating the waveforms of the driving pulses used for driving the arrangement shown in FIG. 5.

From the foregoing it is seen that the arrangement forms an N channel type shift register which is driven with positive driving pulses such as shown in FIG. 6.

The input gate electrodes 16a, 16b, 16c and 16d are supplied with positive driving pulses $\phi_{Ia}$, $\phi_{Ib}$, $\phi_{Ic}$ and $\phi_{Id}$ having respective waveforms $\phi_{Ia}$, $\phi_{Ib}$, $\phi_{Ic}$ and $\phi_{Id}$ as shown in FIG. 6. Note that, in order that the arrangement of FIG. 5 can be always driven, a DC voltage $\phi_{Ib}$ is applied to the second input gate electrode 16b.

Figure 7:
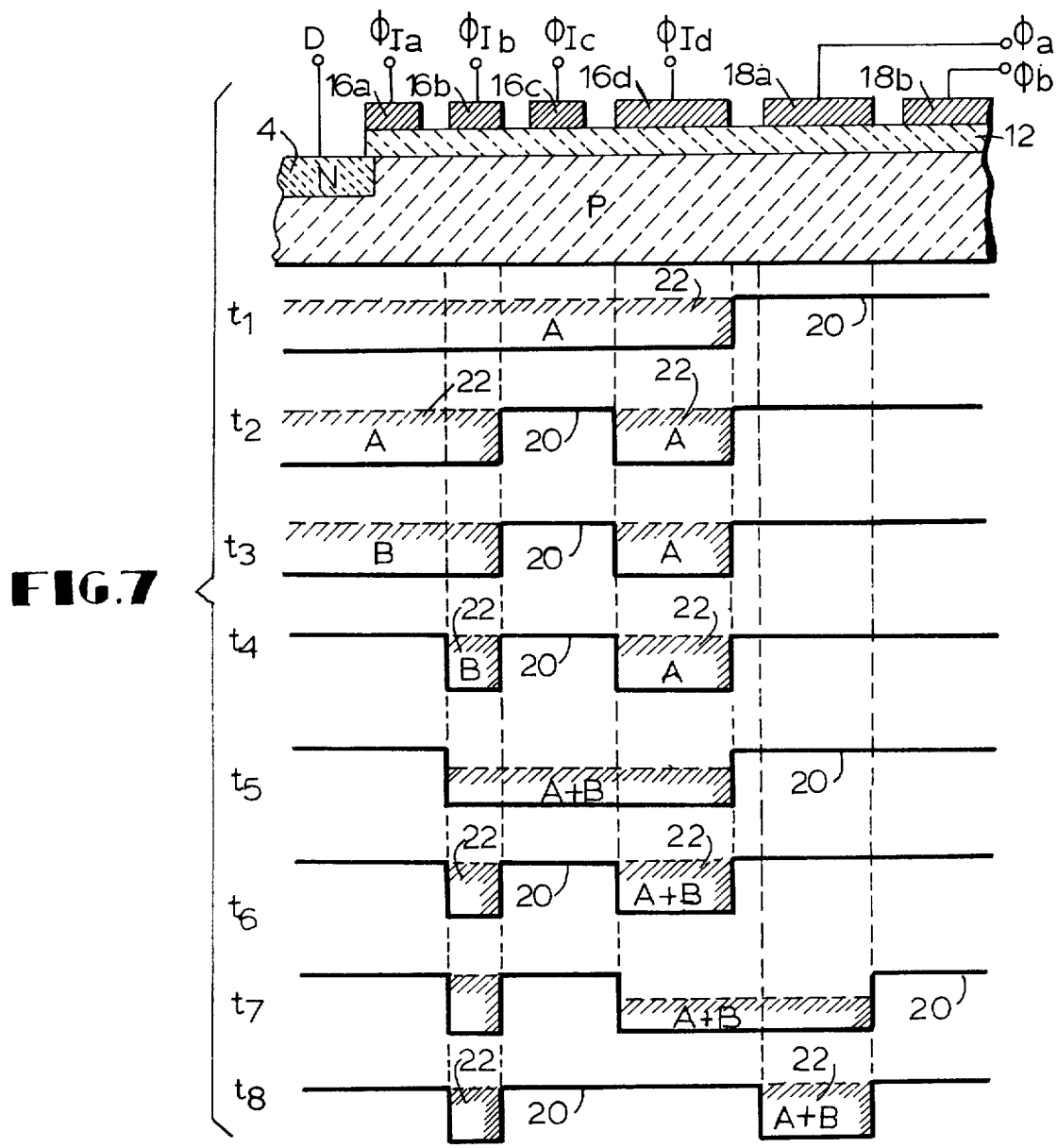
FIG. 7 is an illustration similar to FIG. 3 but showing the present invention.

FIG. 7 shows the arrangement of FIG. 5 and potential wells defined therein at time points $t_1$ through $t_8$ (see FIG. 6) due to potential curve 6 resulting from the driving pulses as shown in FIG. 6 applied to the arrangement with the quantities of charge 22 stored therein. In FIG. 7 the potential wells with the quantities of charge stored therein are illustrated directly under the associated electrodes as shown on the upper portion thereof.

The process of entering 2-bit information (A, B) into the arrangement of FIG. 5 will now be described with reference to FIGS. 6 and 7.

The entry of that 2-bit information is accomplished when the transfer electrode 18a of the first group has no driving pulse $\phi_a$ applied thereto. Also only for purposes of illustration, one bit amount of charge is determined by the quantity of charge capable of accumulation in the potential well defined directly under the second input gate electrode 16b. Therefore two bit amounts of charge can be accumulated in the potential well located directly under the fourth input gate electrode 16d.

In order to drive the arrangement of FIG. 5, the driving pulses $\phi_{Ia}$ through $\phi_{Id}$ are first applied to the input gate electrodes 16a through 16d respectively at time point $t_1$. Under these circumstances, if bit A which is the first input pulse D is a binary ONE then a potential well defined under all the input gate electrodes 16a through 16d is completely filled with an electric charge 22 as shown in row $t_1$ in FIG. 7. If the bit A is a binary ZERO, that potential well is empty. In this way, the first input pulse D or bit A is written into the arrangement of FIG. 5.

At time point $t_2$, the driving pulse $\phi_{Ic}$ has been removed from the third input gate electrode 16c as seen in FIG. 6. This is accompanied by the storage of two bit amounts of charge in a potential well defined directly under the fourth input gate electrode 16d as shown in row $t_2$ in FIG. 7. This is because the bit A was a binary ONE. When the bit A is a binary ZERO, that potential well is empty, or stores a null bit amount.

When time point $t_3$ is reached, the first and second input gate electrodes 16a and 16b have the respective driving pulses $\phi_{Ia}$ and $\phi_{Ib}$ applied thereto (see FIG. 6). At that time, bit B which is the second input pulse D is written in the diffusion region 14 as shown by the waveform D in FIG. 6. If the bit B has the value of binary ONE then a charge 22 is stored in the potential well continuously defined under the electrodes 16a and 16b as shown in row $t_3$ in FIG. 7. On the other hand, if the bit B is a binary ZERO, then that potential well becomes empty. When a binary ZERO bit B follows a binary ONE bit A written at time point $t_1$, the charge 22 stored in the potential well located under the first and second electrodes 16a and 16b respectively due to the binary ONE bit A of binary ONE is removed through the diffusion layer 14 upon writing the bit B in the latter. Therefore no problem arises.

As shown in FIG. 6, the driving pulse $\phi_{Ia}$ is not applied to the first input gate electrode 16a at time point $t_4$. This causes the disappearance of the continuous potential well located in the diffusion region 14 and under the first electrode 16a and the charge is collected and stored in the potential well defined directly under the second input gate electrode 16b. In this case, a binary ONE bit B equals the stored charge of one bit amount as shown in row $t_4$ in FIG. 7. A binary ZERO bit B, however, causes the potential well located under the electrode 16b to store a null bit amount or ZERO charge.

In this way the potential well located directly under the fourth input gate electrode 16d has stored the charge 22 corresponding to the bit A or the first input pulse while the potential well located directly under the second electrode 16b has stored the charge corresponding to the bit B or the second input pulse.

Then at time point $t_5$ the driving pulse $\phi_{Ic}$ is again applied to the third input gate electrode 16c with the result that a potential well is continuously defined directly under the second, third and fourth input gate electrodes 16b, 16c and 16d and accumulates the charge due to the bit A retained by the fourth electrode 16d and that due to the bit B retained by the second electrode 16b a mixed state. Under these circumstances, the quantity of the charge stored in that potential well is equal to three bit amounts when the 2-bit information includes a binary ONE bit A and a binary ONE bit B, to two bit amounts for a binary ONE bit A and a binary ZERO bit B, to one bit amount for a binary ZERO bit A and a binary ONE bit B, and to a null bit amount when each of bits A and B have a value of binary ZERO. Row $t_5$ in FIG. 7 depicts the case in which each of the bits A and B has a value of binary ONE.

Shortly before time point $t_6$ is reached, the driving pulse $\phi_{Ic}$ is removed from the third input gate electrode 16c whereupon the charge stored in the potential well located under the second, third and fourth input gate electrodes 16b, 16c and 16d respectively is partly moved along the surface of the semiconductor layer 10 and stored in a potential well newly defined directly under the fourth electrode 16d. That is, the charge is divided into two portions stored in the potential wells located directly under the second and fourth electrodes 16b and 16d respectively with the ratio therebetween proportional to the ratio of gate area between the second and fourth input gate electrodes 16b and 16d.

Under these circumstances, the potential well located directly under the fourth input transfer electrode 16d has stored therein a quantity of a charge equal to "2 gate amounts" when the 2-bit information includes the bits A and B each having a value of binary ONE (see row $t_6$ in FIG. 7), to "4/3 bit amounts for a binary ONE bit A and a binary ZERO bit B, to ⅔ bit amount for a binary ZERO bit A and a binary ONE bit B; and to a null bit amount when both bits A and B have a value of binary ZERO. This has been already described in conjunction with FIG. 4.

After having stored in the potential well located directly under the fourth input gate electrode 16d, the quantity of the charge, in this case the quantities of charge corresponding to the sum of the first and second pulses is transferred through the semiconductor layer 10 in the same manner as described above in conjunction with FIGS. 2 and 3. More specifically, a driving pulse $\phi_a$ is applied to the first transfer electrode 18a at time point $t_7$ where the driving pulse $\phi_{Id}$ is still applied to the fourth input gate electrode 16d (see FIG. 6). This results in the storage of the charge in a continuous potential well defined under the fourth input gate and first transfer electrodes 16d and 18a respectively as shown in row $t_7$ in FIG. 7.

Then at time point $t_8$, the driving pulse $\phi_{Id}$ disappears from the fourth input gate electrode 16d thereby storing the charge only in a potential well defined directly under the first transfer electrode 18a.

Following this, the process as above described in conjunction with FIGS. 2 and 3 is repeated to transfer the charge through the semiconductor layer 10 stepwise, the charge corresponding to the sum of the first and second input pulses.

As shown in row $t_6$, a useless charge is left in the potential well located directly under the second input gate electrode 16b when the stepwise charge transfer through the semiconductor layer 10 is initiated by driving pulses $\phi_a$, $\phi_b$, $\phi_c$ and $\phi_d$ applied in overlapping relationship to the transfer electrodes 18a through 18d. However, this charge is erased when the next succeeding input pulse is written in the diffusion layer 14 at a time point such as $t_1$. Therefore no problem is encountered.

Also it is recalled that each of the transfer electrodes 18a, 18b, 18c or 18d has an area substantially equal to that of the fourth input gate electrode 16d. This is because all the transfer electrodes have dimensions sufficient to transfer a quantity of charge corresponding to the 2-bit data accumulated directly under the fourth input gate electrode 16d to under the succeeding transfer electrodes. If the driving pulses applied to the transfer electrodes 18a through 18d respectively are high then the area of transfer electrodes may be smaller than that of the fourth input gate electrode 16d.

The operation of the arrangement as shown in FIG. 5 may be modified so that, at time points $t_5$ shown in FIGS. 6 and 7 the sum of the 2-bit data is formed to provide any one of the charge accumulation states shown in FIGS. 4a through 4d as the case may be after which the operation of transferring the charge at time point $t_7$ is immediately performed. In the latter case, the transfer electrodes 18a through 18d are required to transfer a maximum charge equal to 3 bit amounts through the semiconductor layer 10 resulting in an increase in area of each transfer electrode. This does not contribute to an increase in degree of integration.

However, by dividing the charge into two portions stored in the potential wells located directly under the second and fourth input gate electrodes 16b and 16d respectively, the transfer electrodes are required only to transfer a maximum charge equal to 2 bit amounts through the semiconductor layer 10. Accordingly the area of the transfer electrodes can be decreased hence increasing the degree of integration as compared with the driving process omitting the division of the charge at time point $t_6$ as described above.

From the foregoing it is seen that a CCD configuration shift register has been produced by forming the input gate unit thereof of four input gate electrodes 16a through 16d and by applying the abovementioned driving pulses $\phi_{Ia}$ through $\phi_{Id}$ to those input gate electrodes respectively thereby to form the sum of the quantities of charge corresponding to a pair of input signals or pulses to selectively form four charge accumulation states dependent upon the binary values of the input pulses in a potential well defined directly under each of transfer electrodes.

While the present invention has been illustrated and described in conjunction with a single preferred embodiment thereof it is to be understood that numerous changes and modifications may be resorted to without departing from the spirit and scope of the present invention. For example, while the present invention has been described as including the fourth input gate electrode 16d having its area equal to twice that of the second input gate electrode 16b it is to be understood that the fourth input gate electrode is not restricted thereto or thereby. It is essential that the fourth input gate electrode 16d be larger in area than the second input gate electrode 16b. This is because it is sufficient to determine which of the four charge accumulation states is formed upon summing quantities of charge corresponding to the two input pulses.

Also the present invention has been described in terms of a four phase drive but it is to be understood that the present invention is not restricted thereto or thereby and that any desired drive may be employed.

Figure 8:
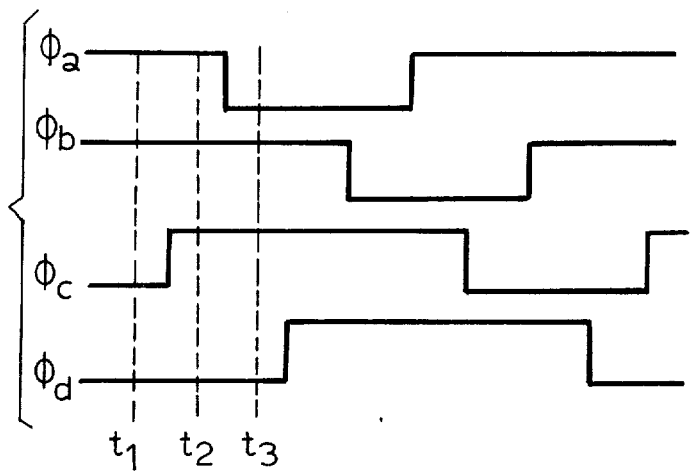
FIG. 8 is a graph illustrating the waveforms of other driving pulses applied to the transfer electrodes shown in FIG. 5.

Further, in the arrangement of FIG. 5, each pair of transfer electrodes are adapted to be supplied with the two associated driving pulses $\phi_a$ and $\phi_b$, $\phi_b$ and $\phi_c$, $\phi_c$ and $\phi_d$ or $\phi_d$ and $\phi_a$ in an overlapping relationship as in the prior art practice. However, at least one pair of transfer electrodes may always have applied thereto the associated driving pulses in the overlapping relationship as shown in FIG. 8. In this case, the area of the transfer electrodes 18a through 18d is first made as small as possible while the area of the fourth input gate electrode 16d is substantially equal to the sum of the areas of the transfer electrodes 18a and 18b adjacent to the fourth input gate electrode 16d. Then, the area of the second input gate electrode 16b is made smaller than that of the fourth input gate electrode 16d.

Figure 9:
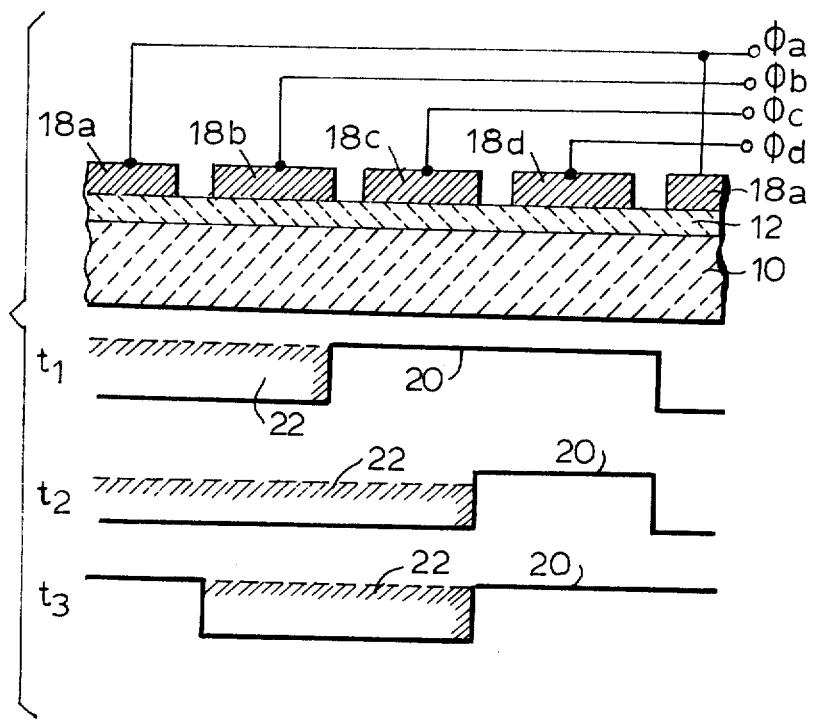
FIG. 9 is an illustration similar to FIG. 7 but showing the application of the driving pulses shown in FIG. 8.

As shown in FIG. 8, the driving pulses $\phi_a$ and $\phi_b$ are applied to the first and second transfer electrodes 18a and 18b respectively to store a charge 22 in a potential well continuously defined under those electrodes 18a and 18b as shown in row $t_1$ in FIG. 9. Then, at time point $t_2$, the driving pulse $\phi_c$ is also applied to the third transfer electrode 18c. That is, the driving pulses $\phi_a$, $\phi_b$ and $\phi_c$ are applied in overlapping relationship to the first, second and third transfer electrodes 18a, 18b and 18c respectively. Under these circumstances, the charge 22 is stored in a potential well continuously located under the first, second and third electrodes 18a, 18b and 18c respectively as shown in row $t_2$ in FIG. 9.

When time point $t_3$ is reached, the driving pulses $\phi_b$ and $\phi_c$ are still applied to the second and third transfer electrodes 18b and 18c while the driving pulse $\phi_a$ disappears from the first transfer electrode 18a. Therefore, the charge 22 is transferred to be stored in a potential well located under the second and third transfer electrodes 18b and 18c as in row $t_3$ in FIG. 9.

Thereafter, the process as described above is repeated as will readily be understood from waveforms shown in FIG. 8 to transfer the charge in a stepped manner with the charge always stored under at least two adjacent transfer electrodes in the semiconductor layer 10.

From the foregoing it is seen that in the arrangement as described above in conjunction with FIGS. 8 and 9, the electrodes are decreased in area while the quantity of charge due to an input signal is not reduced resulting in an increase in the noise margin.

What we claim is:

1. A method of driving a charge coupled semiconductor device comprising a semiconductor layer of a first type conductivity including a main face, an electrically insulating film disposed on said main face of said semiconductor layer, an electrode array of a plurality of transfer electrodes disposed in a consecutive spaced relationship at predetermined intervals on said electrically insulating film for storing an electric charge thereunder and for transferring said electric charge in a predetermined direction along said main face of said semiconductor layer, charge injection means composed of an electrically conductive region of a second type conductivity disposed to form a PN junction with said semiconductor layer, said electrically conductive region being responsive to an input signal applied thereto to produce an electric charge in said semiconductor layer, an input gate unit consisting of a first, a second, a third and a fourth input gate electrode disposed on said electrically insulating film between said electrically conductive region and the transfer electrode on the input side of said electrode array, said fourth input gate electrode being disposed adjacent to said transfer electrode on said input side of said electrode array to form a predetermined spacing therebetween and having an area larger than that of said second input gate electrode, which method comprises the first step of applying gate signals to said first, second, third and fourth input gate electrodes during the time of application of a first input signal to said charge injection means for injecting a charge into said semiconductor layer through said charge injection means, the second step of removing said gate signal applied to said third input gate electrode to store a first charge corresponding to said first input signal directly under said fourth input gate electrode, the third step of applying a gate signal to said first input gate electrode during the time of application of a second input signal to said charge injection means for injecting a charge into said semiconductor layer through said charge injection means, the fourth step of removing said gate signal applied to said first input gate electrode to store a second charge corresponding to said second input signal having a different magnitude than said first change directly under said second input gate electrode, and the fifth of applying gate signals to said second, third and fourth input gate electrodes to store a third charge equal to the sum of said first and second charges directly under said second, third and fourth input gate electrodes.

2. A method of driving a charge coupled semiconductor device as claimed in claim 1 further comprising the sixth step of removing said gate signal applied to said third input gate electrode to store a fourth charge proportional to said sum of said first and second charges directly under said fourth input gate electrode.

3. A charge coupled semiconductor device comprising a semiconductor layer of first type conductivity including a main face, an electrically insulating film disposed on said main face of said semiconductor layer, an electrode array of a plurality of transfer electrodes disposed in a consecutive spaced relationship at predetermined intervals on said electrically insulating film for storing an electric charge thereunder and for transferring said electric charge in a predetermined direction along said main face of said semiconductor layer, charge injection means composed of an electrically conductive region of a second type conductivity disposed to form a PN junction with said semiconductor layer, said electrically conductive region being responsive to an input signal applied thereto to produce an electric charge in said semiconductor layer, an input gate unit consisting of a first, a second, a third and a fourth input gate electrode disposed on said electrically insulating film between said electrically conductive region and the transfer electrode on the input side of said electrode array, said input gate electrodes having predetermined spacings therebetween, said fourth input gate electrode being disposed adjacent to said transfer electrode on said input side of said electrode array having a predetermined spacing therebetween and having an area larger than that of at least said second input gate electrode, and signal applying means for selectively applying signals to said first, second, third and fourth input gate electrodes to form an electric charge corresponding to the 2-bit information representing a pair of consecutive input signals injected into said electrically conductive region by said charge injection means, said signal applying means being constituted by means for applying a gate signal to said first input gate electrode for the time from the start of a first input signal until the end of a second input signal, means for applying a constant gate signal to said second input gate electrode, means for applying a gate signal to said third input gate electrode for the time from the start until the end of the first input signal and for a first predetermined period of time starting a second predetermined period of time after the end of the second input signal, and means for applying a gate signal to said fourth input gate electrode for the time from the start of the first input signal until a third predetermined period of time, greater than the sum of said first and second predetermined periods of time, after the end of the second input signal.

* * * * *